(12) United States Patent
Tsukihara et al.

(10) Patent No.: US 6,794,661 B2
(45) Date of Patent: Sep. 21, 2004

(54) ION IMPLANTATION APPARATUS CAPABLE OF INCREASING BEAM CURRENT

(75) Inventors: Mitsukuni Tsukihara, Ehime (JP); Mitsuaki Kabasawa, Ehime (JP); Michiro Sugitani, Ehime (JP); Hiroki Murooka, Ehime (JP); Hiroshi Matsushita, Ehime (JP)

(73) Assignee: Sumitomo Eaton Nova Corporation, Tokyo (JP)

( * ) Notice: Subject to any disclaimer, the term of this patent is extended or adjusted under 35 U.S.C. 154(b) by 48 days.

(21) Appl. No.: 10/118,064

(22) Filed: Apr. 9, 2002

(65) Prior Publication Data

US 2002/0179854 A1 Dec. 5, 2002

(30) Foreign Application Priority Data

May 29, 2001 (JP) ......................................... 2001-159949

(51) Int. Cl.$^7$ ......................... H01J 37/317; H01J 27/00
(52) U.S. Cl. ......................... 250/492.21; 250/396 ML; 250/423 R
(58) Field of Search ......................... 250/491.1, 492.1, 250/492.2, 492.21, 492.22, 396 R

(56) References Cited

U.S. PATENT DOCUMENTS

| | | | |
|---|---|---|---|
| 4,101,765 A | | 7/1978 | Hooper, Jr. |
| 5,132,544 A | * | 7/1992 | Glavish ................... 250/492.2 |
| 5,523,652 A | * | 6/1996 | Sferlazzo et al. ....... 315/111.41 |
| 5,576,538 A | | 11/1996 | Sakai et al. |
| 6,239,440 B1 | * | 5/2001 | Abbott ................... 250/423 R |
| 6,271,529 B1 | * | 8/2001 | Farley et al. .......... 250/492.21 |
| 6,414,329 B1 | * | 7/2002 | Benveniste et al. .... 250/492.21 |
| 6,486,478 B1 | * | 11/2002 | Libby et al. ............. 250/492.1 |
| 6,573,517 B1 | * | 6/2003 | Sugitani et al. ........ 250/492.21 |

FOREIGN PATENT DOCUMENTS

| | | |
|---|---|---|
| EP | 1 176 623 A2 | 7/2001 |
| JP | 2765111 | 4/1998 |
| JP | 11-96961 | 4/1999 |
| JP | 2001-239153 A | 9/2001 |

OTHER PUBLICATIONS

United Kingdom Search Report; GB 0208395.4, Nov. 26, 2002.

* cited by examiner

Primary Examiner—John R. Lee
Assistant Examiner—Paul M. Gurzo
(74) Attorney, Agent, or Firm—Arent Fox Kintner Plotkin & Kahn, PLLC

(57) ABSTRACT

In an ion implantation apparatus according to the present invention, ions are extracted from an ion source with the aid of extraction electrodes. The ions thus extracted are analyzed in mass by means of a mass analysis magnet apparatus and a mass analysis slit, so that the required ions are implanted in a substrate. Magnets for generating cusp magnetic fields are serially disposed along an ion beam line extending from the front part to the rear part of the mass analysis magnet apparatus.

40 Claims, 12 Drawing Sheets

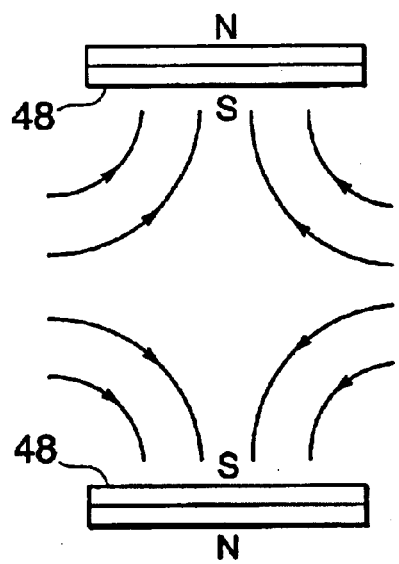
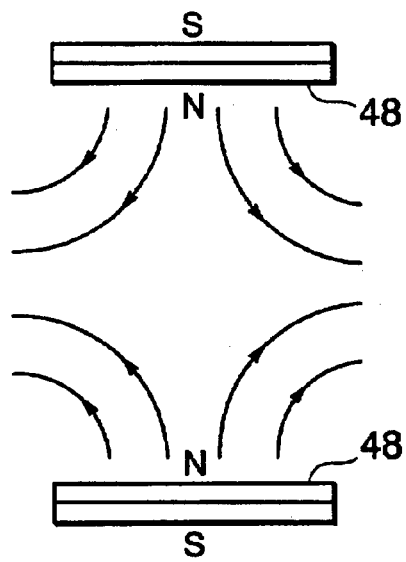
FIG. 8A  FIG. 8B
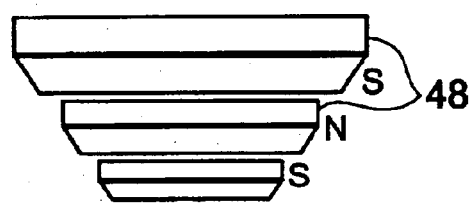
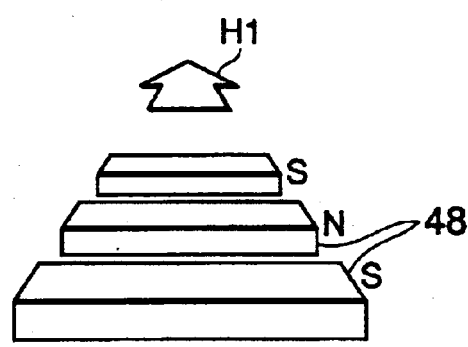
FIG. 9

ION IMPLANTATION APPARATUS CAPABLE OF INCREASING BEAM CURRENT

BACKGROUND OF THE INVENTION

1. Field of the Invention

The present invention relates to an ion implantation apparatus.

2. Description of the Related Art

In the recent technology of ion implantation, along with the requirement to provide fine structures in semiconductor devices, the energy applied to ions, which are used for implantation, has been decreased more and more in order to decrease the depth of implantation. At low energies, ions traveling along a beam line from an ion source to a substrate increase the beam size in radius, because the ions in an ion beam repel each other by means of their own charge. This is referred to as the space charge effect, and this effect occasionally causes a problem in that a sufficiently large ion beam current cannot be obtained due to the decreased efficiency in the transportation of the ions.

The ion beam diverges since the positive charges therein are forced to be separated from each other due to the repulsive force therebetween. This space charge effect becomes more prominent with a decrease in the ion energy as well as with an increase in the ion beam current. Therefore, it is very important to suppress the space charge effect and thereby to decrease the divergence of the ion beam due to the repulsion of charged particles in order to obtain a high ion beam current, particularly in an ion implantation apparatus in which low-energy ions are used.

The space charge effect resulting from the fact that the ions each have a positive charge can be reduced by the charge cancellation or charge neutralization, if electrons and/or ions having a negative charge exist among the positive charges. Referring now to FIG. 1, the neutralization mechanism will be explained.

In FIG. 1, ions generated in an ion source 11 can be extracted as an ion beam with the aid of a set of extraction electrodes 12. The ions thus extracted pass through both a mass analysis magnet (not shown) and a mass analysis slit 13, and then are implanted into a substrate 14, which is disposed in a process chamber 15. The pathway of the ion beam from the ion source 11 to the process chamber 15 is hermetically sealed by means of a housing, i.e., a vacuum chamber 16. The constitution extending from the ion source 11 to the process chamber 15 is referred to as an ion beam line.

In the ion beam line, there are a number of electrons, secondary electrons, and negative ions. The electrons are generated by the ionization of residual gas molecules in the vacuum chamber 16, when the ion beam collides with the residual gas molecules. The secondary electrons are generated from structural elements arranged along the ion beam line when the ion beam collides with these elements. Irradiating molecules or atoms with the electrons generates the negative ions.

In FIG. 1, P1 represents the collision of ions with the extraction electrode 12. P2 represents the collision of ions having a greater mass than the primary ions with the inner wall of the vacuum chamber 16. P3 represents the collision of ion beams with the residual gas in the vacuum chamber 16. P4 represents the collision of ions having a lighter mass than the primary ions with the Inner wall of the vacuum chamber 18. P5 represents the collision of the ion beam with the mass analysis slit 13. P6 represents the collision of the ion beam with the substrate 14 which is a target.

In order to increase the beam current at the final stage by reducing the space charge effect, using the above-mentioned effect, the following method has been proposed. A gas is intentionally introduced into the vacuum chamber 16 constituting the ion beam line, and then the gas is ionized by the ion beam. As a result, the space charge effect is reduced by the electrons generated due to the ionization.

As described, for instance, in Japanese patent publication No. 2765111, the introduction of the gas into the ion beam transportation line causes the frequency at which the ions in the ion beam collide with gaseous molecules in the ion beam trajectory to increase. As a result, the actual number of electrons in the ion beam increases so that the space charge effect in the ion beam can be reduced.

As described in Japanese Unexamined Patent Publication No. 11-96961, another method has been proposed, wherein molecules, for instance, water ($H_2O$), which can easily be polarized and thereby provide negative ions, are used to neutralize the space charges. The above-mentioned two methods are proposed for attaining the same object.

The above method of introducing the gas into the vacuum chamber provides a greater amount of secondary electrons. However, the ion beam current loss increases due to the collision of the ions with the gas. As a result, the beam current reaches a maximum at a certain gas pressure and thereafter decreases, even if the amount of introduced gas is further increased.

As described above, the generation and disappearance of electrons are repeated in the vacuum chamber 16, and thereby the amount of electrons at each moment is determined by the balance of the generation and disappearance. From this viewpoint, it is necessary to increase the number of electrons at a certain balance in order to completely eliminate the space charge effect.

In other words, it is effective to lengthen the lifetime of the electrons and negative ions existing during the interval between the generation and the disappearance in order to substantially increase the amount of electrons necessary for neutralizing the charges in the ion beam without loss of the ion beam current itself.

SUMMARY OF THE INVENTION

Accordingly, it is an object of the present invention to provide an ion implantation apparatus capable of easily increasing the beam current, particularly in the low energy range.

An ion implantation apparatus according to the present invention comprises an ion beam line extending from an ion source for generating ions to a substrate. The ion beam line includes extraction electrodes for extracting ions from the ion source as an ion beam, a mass analysis magnet apparatus for carrying out mass analyzing of the extracted ions, and a mass analysis slit through which the analyzed ions pass. The ions passed through the mass analysis slit are implanted into the substrate directly or after being accelerated or decelerated.

According to aspect of the present invention, the ion beam line is provided with a magnet assembly for forming cusp magnetic fields.

For instance, the magnet assembly is disposed inside the mass analysis magnet apparatus and in sections of the ion beam line that continue to front and rear parts of the mass analysis magnet apparatus.

The magnet assembly may be disposed in a section of the ion beam line that extends from the vicinity of the extraction electrodes to the vicinity of the exit of the mass analysis magnet apparatus.

The magnet assembly may be disposed in a section of the ion beam line that extends from the vicinity of the extraction electrodes to the entrance of the mass analysis magnet apparatus.

The magnet assembly may be disposed in a section of the ion beam line that extends from to the exit of the mass analysis magnet apparatus to the vicinity of the mass analysis slit.

The magnet assembly may be disposed in a section of the ion beam line that extends from the vicinity of the mass analysis slit to the substrate.

The magnet assembly may be disposed in a section of the ion beam line that extends from the vicinity of the entrance of the mass analysis magnet apparatus to the vicinity of the mass analysis slit.

The magnet assembly may be disposed in a section of the ion beam line that extends from the vicinity of the extraction electrodes to the vicinity of the mass analysis slit via the mass analysis magnet apparatus.

The magnet assembly may be disposed in a section of the ion beam line that extends from the vicinity of the extraction electrodes to the vicinity of the substrate via both the mass analysis magnet apparatus and the mass analysis slit.

According to another aspect of the present invention, the distance between the rear part of the mass analysis magnet apparatus and the mass analysis slit is designed to be more than two times greater than the distance between the extraction electrodes and the front part of the mass analysis magnet apparatus. And a cusp magnetic field for converging the mass analyzed ion beam is interposed on the beam line between the rear part of the mass analysis magnet apparatus and the mass analysis slit.

According to further aspect of the present invention, the ion beam line further includes acceleration or deceleration electrodes for accelerating or decelerating the ions passed through the mass analysis slit. The distance between the rear part of the mass analysis magnet apparatus and the mass analysis slit is designed to be more than two times greater than the distance between the extraction electrodes and the front part of the mass analysis magnet apparatus, and at the same time the distance between the mass analysis slit and the substrate, together with the acceleration or deceleration electrodes interposed therebetween, is designed to be smaller that half of the distance between the rear part of the mass analysis magnet apparatus and the mass analysis slit.

BRIEF DESCRIPTION OF THE DRAWINGS

FIGS. 8A and 8B are drawings for explaining the generation of two different type cusp magnetic fields, using a pair of upper and lower magnets in the cusp magnetic field magnet assembly;

FIG. 9 is a perspective view of the cusp magnetic field magnet assembly in FIGS. 8A and 8B when viewed in the direction of the ion beam;

DESCRIPTION OF THE PREFERRED EMBODIMENTS

Figure 2:
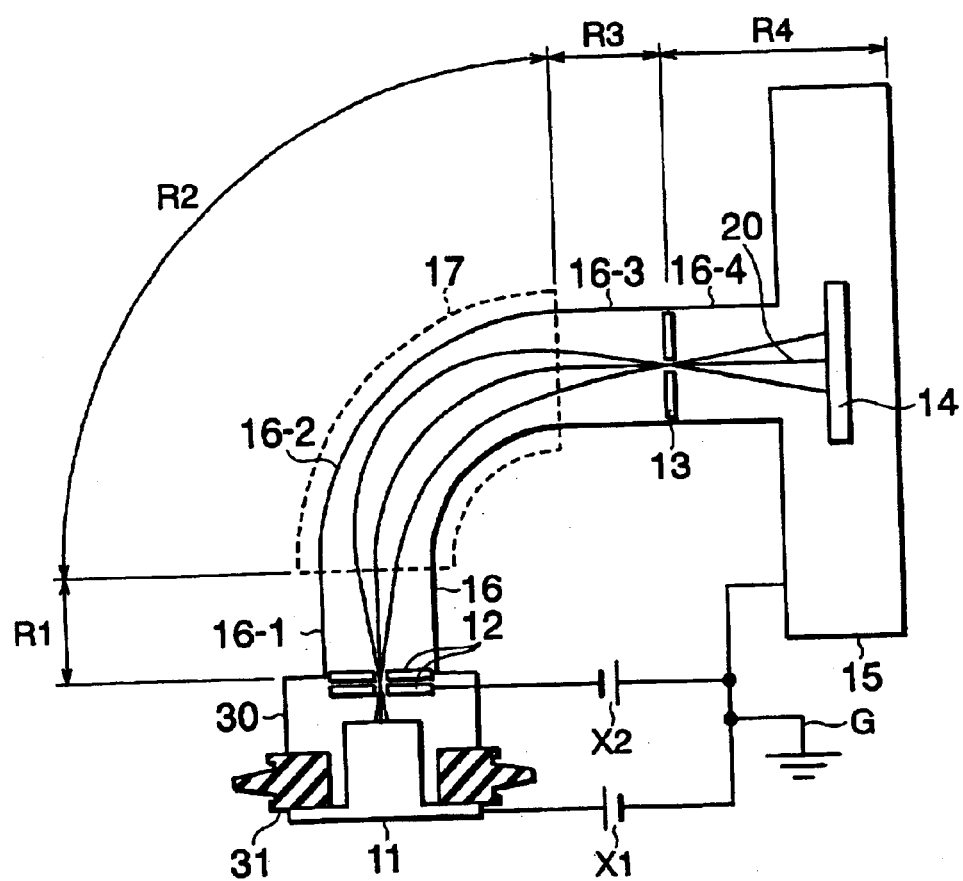
FIG. 2 is a sectional drawing showing the general arrangement of an ion implantation apparatus to which the present invention can be applied.

Referring now to FIG. 2, the general arrangement of an ion beam line in an ion implantation apparatus will be described for the sake of easily understanding the present invention. In FIG. 2, an ion beam 20 is extracted from an ion source 11, by passing through a set of extraction electrodes 12. The ion beam 20 thus extracted is analyzed in mass by means of a mass analysis magnet apparatus 17 and a mass analysis slit 13 disposed in the rear stage thereof, so that only the required ion species is selected. Then, the ions thus selected are implanted into a substrate 14.

The space in which the ion beam is transported can be divided into the following four sections:

(1) a mass analysis magnet front section R1 from the extraction electrodes 12 to the mass analysis magnet apparatus 17;

(2) a mass analysis magnet section R2 inside the mass analysis magnet apparatus 17;

(3) a mass analysis magnet rear section R3 from the mass analysis magnet apparatus 17 to the mass analysis slit 13; and (4) an implantation section R4 from the mass analysis slit 13 to the substrate 14.

A vacuum chamber 16 includes a joint housing 16-1 corresponding to the mass analysis magnet front section R1, a beam guide 16-2 corresponding to the mass analysis magnet section R2, a joint housing 16-3 corresponding to the mass analysis magnet rear section R3, and a joint housing 16-4, which is a part of the implantation section R4, i.e., the part extending from the mass analysis slit 13 to the entrance of a process chamber 15. The ion source 11 is installed in a source housing 30. The ion source 11 and the source housing 30 are separated from each other by an insulator 31. The positive terminal of a power supply X1 is connected to the ion source 11, and the negative terminal of another power supply X2 is connected to the extraction electrode 12. The negative terminal of the power supply X1 and the positive terminal of the power supply X2 are both connected to the process chamber 15 and are also grounded.

Figure 3:
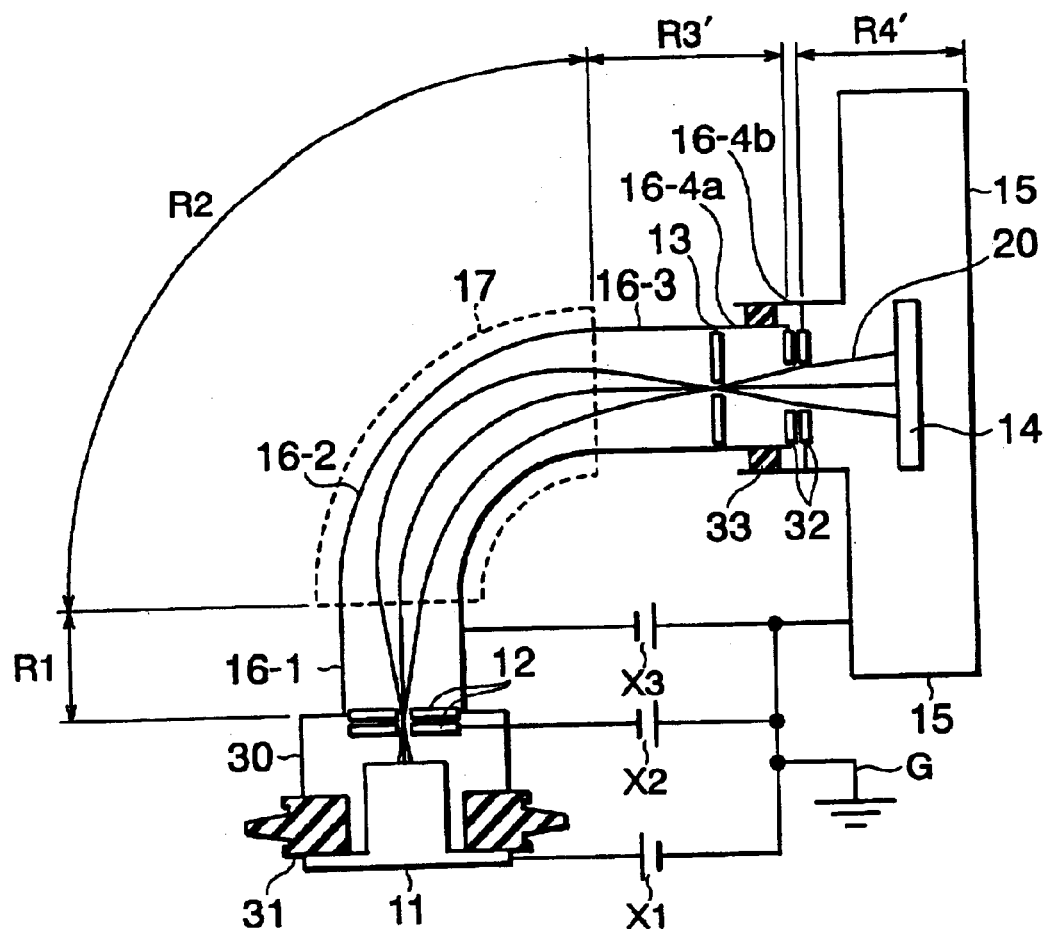
FIG. 3 is a sectional drawing showing the general arrangement of an ion implantation apparatus including a deceleration or acceleration mechanism at the rear stage, to which apparatus the present invention can be applied.

FIG. 3 shows the general arrangement of the ion beam line in an ion implantation apparatus in which rear stage acceleration or rear stage deceleration is employed. In FIG. 3, the same reference numerals as in FIG. 2 are attached to functional elements similar to those in FIG. 2. Rear stage electrodes 32 are interposed between the mass analysis slit 13 and the process chamber 15. The mass analysis slit 13 and the front part of the rear stage electrodes 32 are connected to each other via a joint housing 16-4a, and the perimeter of the joint housing 16-4a and the process chamber 15 are connected to each other via a joint housing 16-4b. An insulating element 33 is interposed between the joint housing 16-4a and the joint housing 16-4b.

The ion beam extracted from the ion source 11 is analyzed in mass by means of both the mass analysis magnet apparatus 17 and the mass analysis slit 13 disposed at the rear stage thereof, so that only ions of the required species are selected. The ions thus selected are decelerated or accelerated by the rear stage electrodes 32, after passed through the mass analysis slit 13. The direction of an electric field applied to the rear stage electrodes 32 determines whether the ions are decelerated or accelerated. In other words, an inverse electric field provides deceleration of the ions, whereas a normal electric field provides acceleration of the ions.

Generally, the mass analysis slit 13 is disposed upstream in the vicinity of the rear-stage electrodes 32, while a part of the rear-stage electrodes 32 can be used so as to function as the mass analysis slit 13.

In the ion implantation apparatus equipped with the rear-stage deceleration or the rear-stage acceleration, the space in which the ion beam travels can also be divided into the following four sections:

(1) a mass analysis magnet front section R1 from the extraction electrodes 12 to the mass analysis magnet apparatus 17;

(2) a mass analysis magnet section R2 in the mass analysis magnet apparatus 17;

(3) a mass analysis magnet rear section R3' from the mass analysis magnet apparatus 17 to the rear stage electrodes 32; and (4) an implantation section R4' from the rear stage electrodes 32 to the substrate 14.

In this case, the negative terminal of a power supply X3 is connected to the joint housing 16-1, and the positive terminal thereof is connected to both the process chamber 15 and ground. Moreover, there are two spaces in the vicinity of the rear-stage electrodes 32, i.e., one space extending from the mass analysis magnet 17 to the rear stage electrodes 32 and another space extending from the rear stage electrodes 32 to the substrate 14. Since there is no electric field in the two spaces, the structural arrangement shown in FIG. 3 is substantially the same as that in FIG. 2, when studying the motion of electrons therein, and therefore there is no need to separately treat the spaces.

The present invention is characterized by employing a method in which electrons are confined in a space along the ion beam line with the aid of a magnetic field in order to suppress disappearance of the electrons along the ion beam line in such an ion implantation apparatus as shown in FIGS. 2 and 3.

Figure 4A:
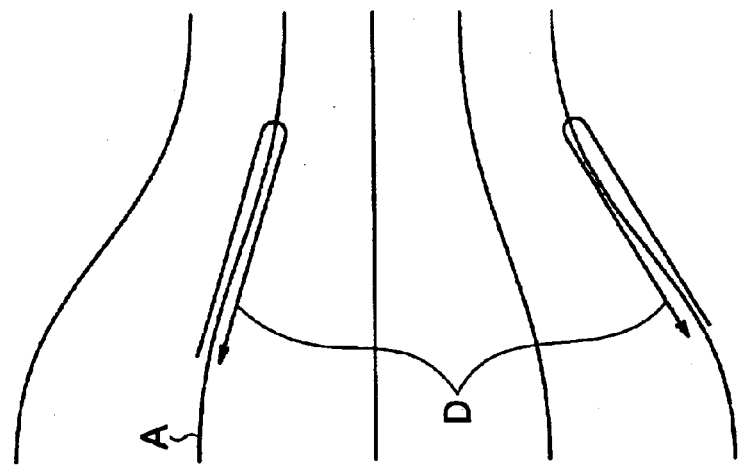
FIGS. 4A and 4B are drawings for explaining electron trajectories in quasi-homogeneous and inhomogeneous magnetic fields, respectively.
Figure 4B:
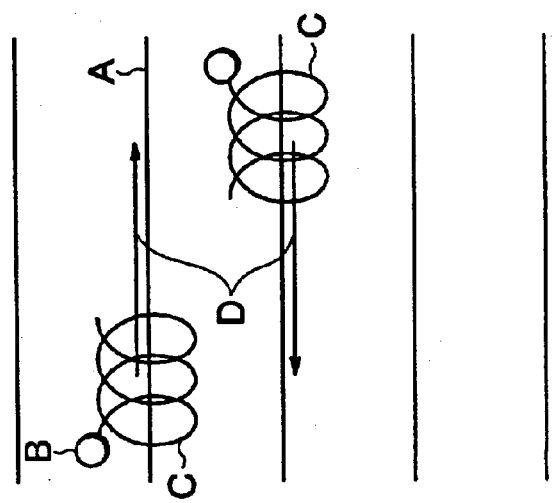

Referring now to FIGS. 4A and 4B, a method for confining electrons into the ion beam line with the aid of a magnetic field will be described. FIG. 4A shows the trajectories of electrons in a quasi-homogeneous magnetic field, whereas FIG. 4B shows the trajectories of the center in the spiral motion of electrons in an inhomogeneous magnetic field. Symbols A, B, C and D represent a line of magnetic force, an electron, a spiral trajectory of electron B and a trajectory of the guiding center of electron B, respectively.

The electron B moves spirally along the magnetic force line A in the magnetic field. The trajectory D of the center of the spiral motion is aligned to be parallel to the magnetic force line A in the homogeneous magnetic field, as shown in FIG. 4A. However, as shown in FIG. 4B, the electrons repel each other when they proceed in the direction in which the magnetic force lines A converge, i.e., in the direction in which the magnetic field strength increases. Usually, the magnetic force lines concentrate in the vicinity of a magnetic pole, so that the almost all electrons cannot proceed toward the magnetic pole. When such magnetic poles are arranged on the walls of the vacuum chamber, the electrons cannot approach the walls, thereby suppressing the disappearance of the electrons. As a result, the whole surface of the vacuum chamber provides an electron-confining effect.

Figure 5:
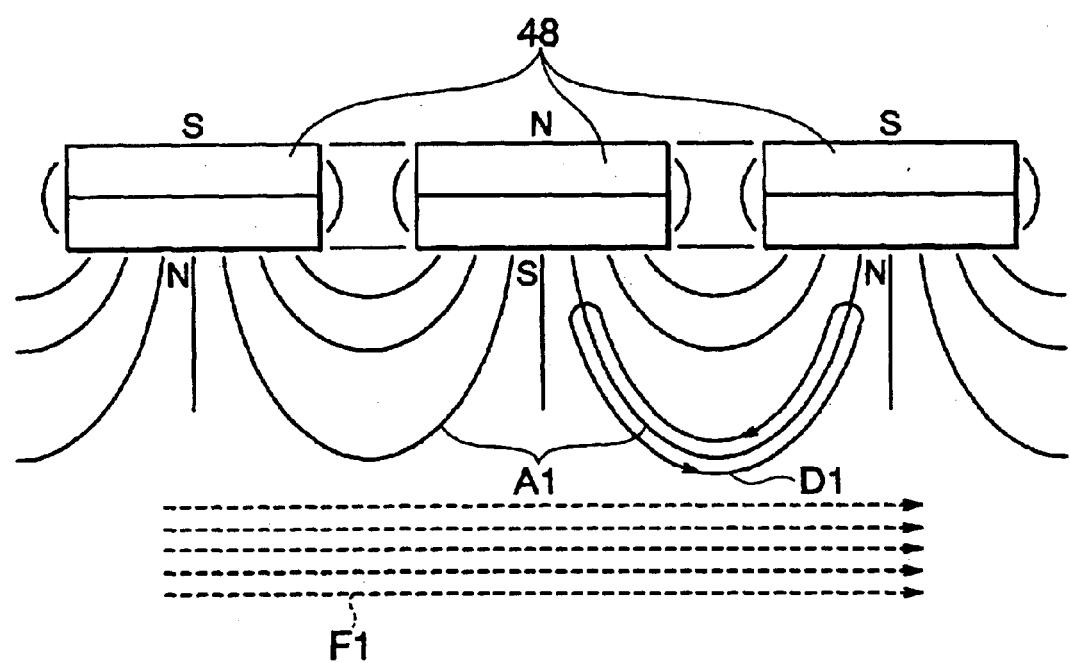
FIG. 5 is a drawing for explaining the electron trajectories in cusp magnetic fields.
Figure 6:
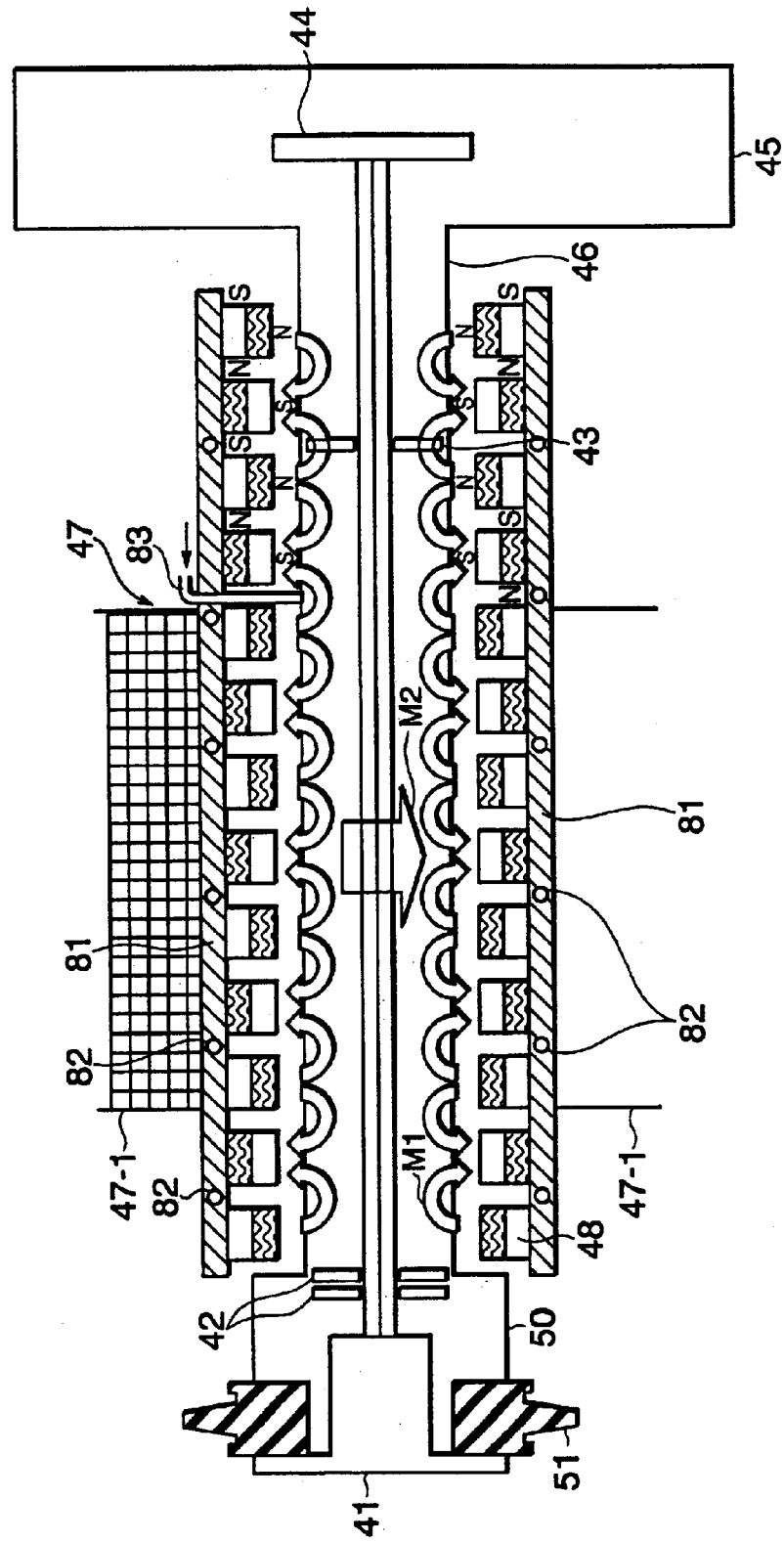
FIG. 6 is a sectional view of a magnet assembly for generating cusp magnetic fields in the case of applying the present invention to the ion Implantation apparatus shown in FIG. 2.

In FIG. 5, permanent magnets 48 are mounted onto an outer wall of the vacuum chamber. These permanent magnets 48 are arranged along the ion beam trajectory F1 by alternately disposing the poles in such a sequence as N, S, N, S, . . . , at the side of the ion beam trajectory F1. Generally, a magnetic field produced by such a magnet assembly is referred to as a cusp magnetic field. In the cusp magnetic field, electrons move spirally along a magnetic force line A1, and repel each other before they arrive at the magnetic pole of the permanent magnet 48, so that a trajectory D1 of the spiral motion of the electrons remains in vacuum. As a result, electrons in the vicinity of the ion beam trajectory F1 cannot disappear, hence substantially increasing the number of electrons in the vicinity of the ion beam trajectory F1. The space charge effect in the ion beam is suppressed due to the increase in the number of electrons in the vicinity of the ion beam trajectory F1, and therefore either the divergence or disappearance of the ion beam can be reduced. This means an increase in the ion beam current Referring now to FIGS. 6 and 7, an embodiment of an ion implantation apparatus according to the present invention will be described. In FIG. 6, an ion beam extracted from an ion source 41 via extraction electrodes 42 is analyzed in mass by means of both a mass analysis magnet apparatus 47 and a mass analysis slit 43 disposed in the rear stage thereof, and then only ions of the required species are selected. The ions thus selected are implanted into a substrate 44 in a process chamber 45. A vacuum chamber 46 is interposed between the ion source 41 and the process chamber 45. The mass analysis magnet apparatus 47 is disposed outside of the vacuum chamber 46. The ion source 41 is installed in a source housing 50, in which case, an insulator 51 separates the ion source 41 and the source housing 50 from each other. The electrical connections of the power supply to the ion source 41, the extraction electrodes 42, etc are the same as those in the arrangement in FIG. 2.

Figure 1:
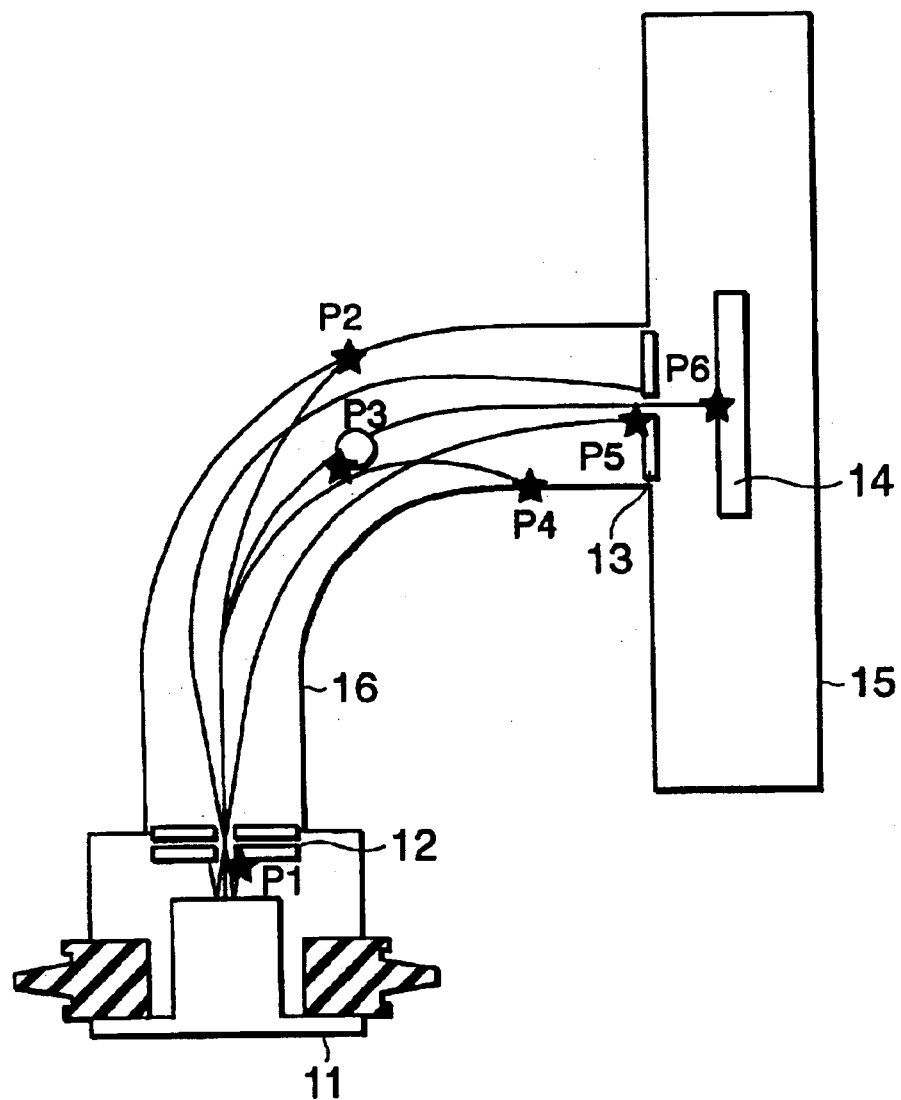
FIG. 1 is a drawing explaining the generation of secondary electrons by means of an ion beam in a conventional ion implantation apparatus.
Figure 7:
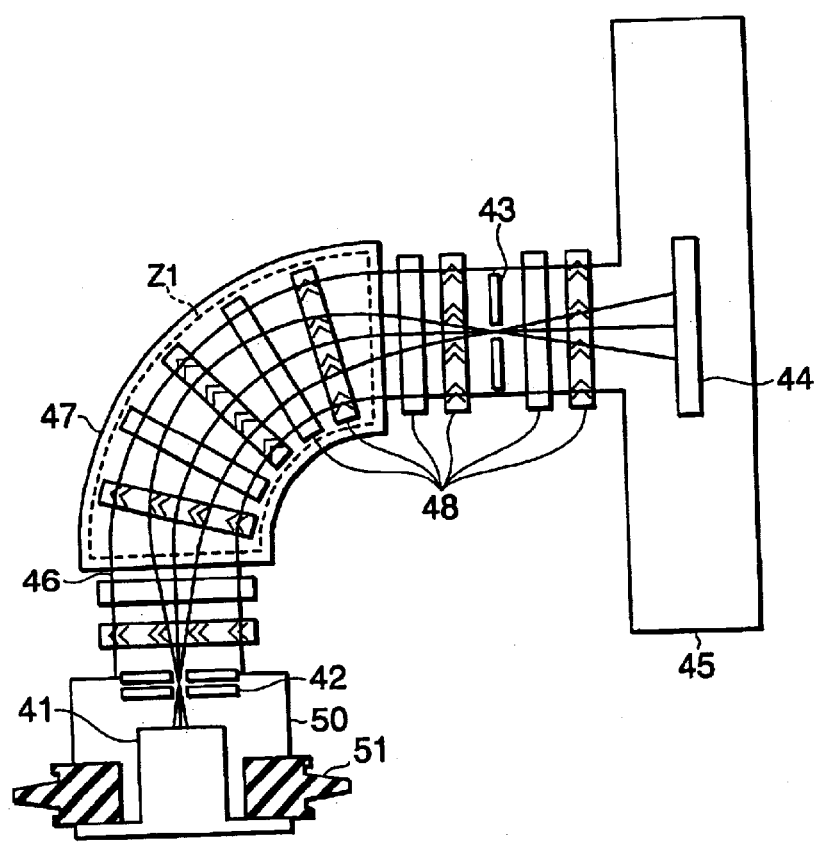
FIG. 7 is a plan view of the magnet assembly for generating the cusp magnetic fields shown in FIG. 6.

In the ion implantation apparatus of this embodiment, permanent magnets 48 are arranged outside of the vacuum chamber 46 in such a way that the symmetry in the geometrical structure and magnetic fields can be preserved with respect to the ion beam in order to generate the above-mentioned cusp magnetic fields. Namely, the permanent magnets 48 each providing the same magnetic field strength are disposed in the alternating pole arrangement along the ion beam in such a manner that the same poles face each other, with the ion beam being interposed between the poles. In FIGS. 6 and 7, parts indicated by a wave-like pattern in the permanent magnets 48 represent N poles, whereas parts indicated by a blank area represent S poles. Preferably, the permanent magnets 48, which face each other, are arranged so as to maintain the same spacing between the magnets and the ion beam. In such an arrangement of the permanent magnets 48, the magnetic fields generated from the facing permanent magnets 48 are cancelled at the center of the ion beam trajectory, and therefore there are no strong magnetic fields in the vicinity of the ion beam trajectory. The structural arrangement of these permanent magnets 48 can be referred to as a magnet assembly (cusp magnetic field magnet assembly). In FIG. 6, 47-1 represents the magnetic poles of the mass analysis magnet apparatus 47, while M1 and M2 represent the magnetic fields generated by the permanent magnets 48 and the mass analysis magnet apparatus 47, respectively. In FIG. 7, the broken lines 47 represent the effective area of the magnetic field in the mass analysis magnet apparatus 47.

In FIG. 8A, permanent magnets 48 each having an S pole are disposed on two planes, preferably, the upper and lower planes, with the ion beam line being interposed between the planes and the S poles facing each other. This pattern is repeated in the direction in which the ion beam line extends. On the other hand, in FIG. 8B, the permanent magnets 48 each having an N pole are disposed on two planes, preferably, the upper and lower planes, with the ion beam line being interposed between the planes and the N poles facing each other. This pattern is also repeated in the direction in which the ion beam line extends. The magnet assembly is constituted by repeating an alternating arrangement of the two types of permanent magnets 48 in FIG. 8A and FIG. 8B in the ion beam direction. FIG. 9 is a perspective view of the magnet assembly viewed in the ion beam direction. The S and N poles are alternately arranged along the ion beam direction H1 on the upper and lower planes, and the cusp magnetic fields are formed between the planes. Hereafter, such magnets for producing the cusp magnetic fields are referred to as cusp magnetic field magnets.

Moreover, as can be seen in FIG. 7, the mass analysis magnet apparatus 47 is substantially fan-shaped in plan view. In this case, the spacing between adjacent permanent magnets 48 disposed in the area of the mass analysis magnet apparatus 47 increases as the position changes from the inside radius to the outside radius of the mass analysis magnet apparatus 47. This means that the strength of the cusp magnetic field produced by the permanent magnets 48 decreases as the position changes from the inside radius to the outside radius of the mass analysis magnet apparatus 47. In order to remove this effect, it is necessary to modify the structure of the magnets so as to increase the magnetic strength as the position changes from the inside radius to the outside radius of the mass analysis magnet apparatus 47. For instance, each permanent magnet 48 can be divided into several sections in the longitudinal direction, and these sections are combined so as to increase the magnetic field as the position changes from the inside radius to the outside radius of the mass analysis magnet apparatus 47. Otherwise, each permanent magnet 48 can be produced in such a way that it is substantially fan-shaped in plan view and at the same time the width of the permanent magnet 48 increases as the position changes from the inside radius to the outside radius of the mass analysis magnet apparatus 47. As a result, the permanent magnets 48 which are substantially fan-shaped provide a magnetic field, the strength of which increases from the inside radius to the outside radius of the mass analysis magnet apparatus 47.

Returning now to FIG. 6, outside of the magnetic field M2 generated by the mass analysis magnet apparatus 47, that is, outside of the magnetic poles 47-1 of the mass analysis magnet apparatus 47, the cusp magnetic field magnets can be arranged in such a way that four planes surround the ion beam line. Such an arrangement provides a further increased effect of confining the electrons in the space defined by the pole faces. This means that, in FIG. 6, the cusp magnetic field magnets are disposed not only on the upper and lower planes with respect to the ion beam line, but also on the sides orthogonal to the plane of the drawing. This is because electrons move in arbitrary directions inside an area where there is no wide homogeneous magnetic field, such as the analyzing magnetic field produced by the mass analysis magnet apparatus 47. In this case, a tunnel surrounded by the four planes, i.e., the upper, lower, left and right planes, is formed along the ion beam line by means of the cusp magnetic fields. The arrangement of the cusp magnetic field magnets is, of course, not restricted to the above arrangement. For instance, another arrangement can be provided by rotating the cusp magnetic field magnets disposed on the four planes by an arbitrary angle around the axis of the ion beam line.

Figures 10A, 10B:
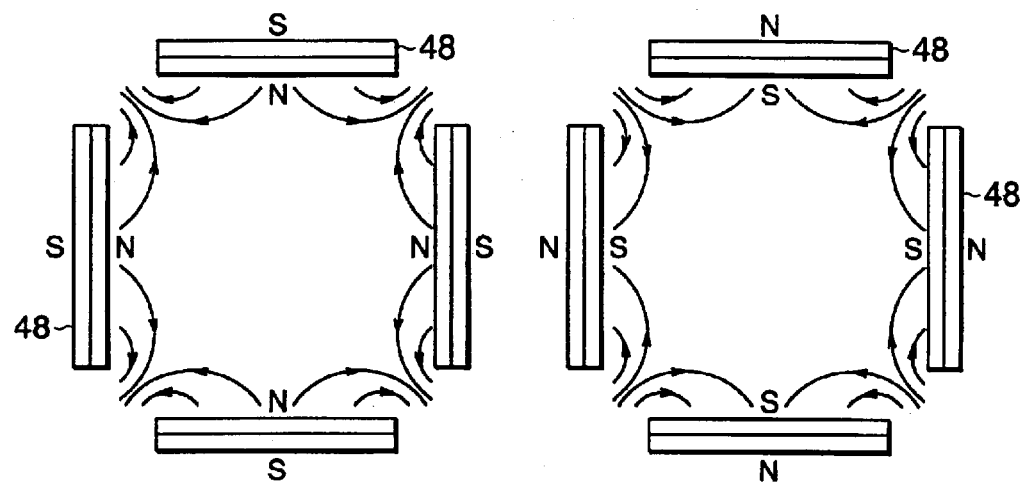
FIGS. 10A and 10B are drawings for explaining the generation of two different types of cusp magnetic fields in a first embodiment, using a set of upper and lower magnets and left and right magnets, both facing each other, in the cusp magnetic field magnet assembly.
Figure 11:
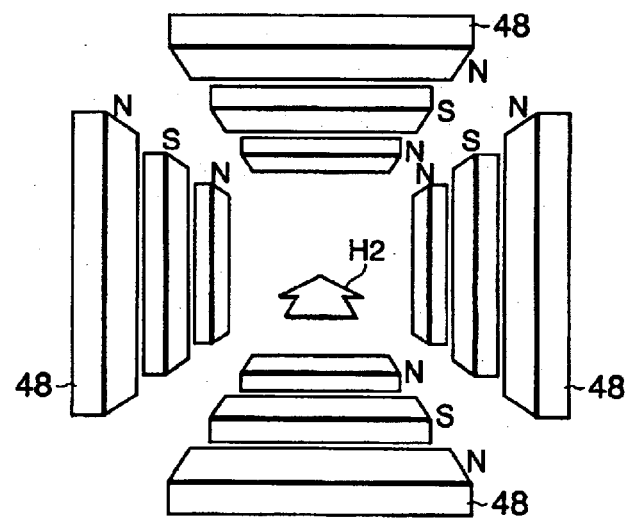
FIG. 11 is a perspective view of the cusp magnetic field magnet assembly in FIGS. 10A and 10B when viewed in the direction of the ion beam.

In order to provide such a tunnel of cusp magnetic field magnets, two different types of tunnel can be derived in accordance with the arrangement of the magnetic poles of the magnets. The first type of tunnel can be obtained by combining the magnet arrangements in FIG. 10A with those in FIG. 10B. In FIG. 10A, four permanent magnets 48 are disposed in such a way that their N pole surfaces are placed on the four planes surrounding the ion beam. In FIG. 10B, four permanent magnets 48 are disposed in such a way that their S pole surfaces are placed on the four planes, i.e., the upper, lower, left and right planes, surrounding the ion beam. The tunnel is formed by alternately repeating such two types of magnet arrangements in the direction of the ion beam. FIG. 11 is a perspective view of such a magnet arrangement in the direction of the ion beam. On each of the four planes, i.e., the upper, lower, left and right planes, N and S poles are alternately repeated in the direction H2 of the ion beam, thus forming the cusp magnetic fields.

Figures 12A, 12B:
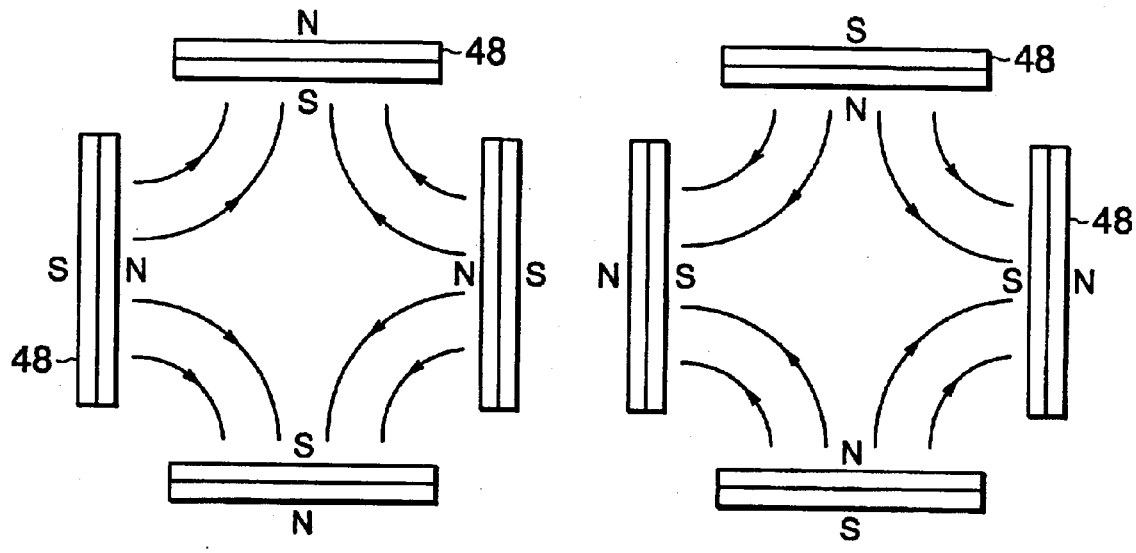
FIGS. 12A and 12B are drawings for explaining the generation of two different types of cusp magnetic fields in a second embodiment, using a set of upper and lower magnets and left and right magnets, both facing each other, in the cusp magnetic field magnet assembly.
Figure 13:
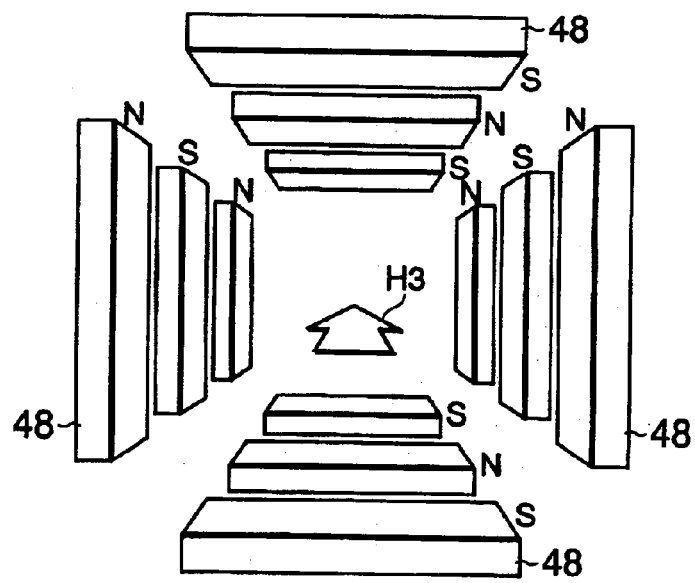
FIG. 13 is a perspective view of the cusp magnetic field magnet assembly in FIGS. 12A and 12B when viewed in the direction of the ion beam.

The second type of tunnel is formed by combining the magnet arrangements in FIG. 12A with those in FIG. 126. In FIG. 12A, the S poles of the upper and lower permanent magnets 48 face each other, whereas the N poles of the left and right permanent magnets 48 face each other. In FIG. 12B, the N poles of the upper and lower permanent magnets 48 face each other, whereas the S poles of the left and right permanent magnets 48 face each other. The tunnel is formed by alternately repeating such two types of magnet arrangement in the direction of the ion beam FIG. 13 is a perspective view of such a magnet arrangement, viewed in the direction of the ion beam. On each of the upper, lower, left and right surfaces, N and S poles are also alternately repeated in the direction H3 of the ion beam, thus forming the cusp magnetic field.

The first type of tunnel is different from the second type of tunnel regarding the fact that the magnet arrangements in FIGS. 12A and 12B provide a quasi-quadrupoia magnet. It is know that the quadrupole magnet enables charged particles to be converged in one plane, and at the same time to be diverged in another plane. When, therefore, these quadrupole magnet are arranged by alternately repeating the S and N poles, the ion beam is transported with high efficiency by alternately repeating the convergence and divergence.

Turing back to FIG. 5, each of the permanent magnet 48 is attached to the outer wall of the vacuum chamber 46 by the use of a supporting member or element 81. For convenience, the permanent magnets 48 are shown in FIG. 5 in the state that each of the permanent magnet 48 is separate from the outer wall or the vacuum chamber 46. The supporting member 81 may be provided with a cooling circuit 82 therein to circulate water for cooling. Furthermore, the vacuum chamber 46 is provided with an inlet portion 83 for introducing a gas into the vacuum chamber 46. Such a supporting member 81, cooling circuit 82, and inlet portion 83 are applied to the case that the permanent magnets 48 are disposed inside the vacuum chamber 46 which will shortly be described. In this event the supporting member 81 is attached to an inner wall of the vacuum chamber 46.

When each of the upper, lower, left and right cusp magnetic field magnets is partially or entirety disposed in air, it is desirable that the strength of these magnetic fields be designed to be on the order of 1 k Gauss (0.1 Tesla) at the vacuum side surface of the vacuum chamber. In order to avoid metal contamination, the cusp magnetic field magnets are preferably secured in air, where they do not come into a direct contact with the ion beam. However, in order to generate a magnetic field having a field strength of approximately 1 k Gauss on the vacuum side from the air side, when the wall thickness of the vacuum chamber is taken into account, it is necessary to further increase the magnetic field strength at the surfaces of the cusp magnetic field magnet by several hundred Gauss.

When the cusp magnetic field magnets are produced by permanent magnets and at the same time the material for the magnets has a residual magnetic flux density of the order of 10 k Gauss at the normal temperature, a desired strength of the magnetic field can steadily be obtained by permanent magnets having a thickness of a few millimeters, thereby making it possible to enhance the degree of freedom regarding the space. A neodymium-iron-boron magnet or a samarium-cobalt magnet can be used as a typical material.

An electromagnet can, of course, be employed as a cusp magnetic field magnet, instead of the permanent magnet 48. In this case, there is a problem in that the overall system, including a power supply for energizing the magnets, becomes large. However, this system is also effective because a greater magnetic field can be produced by employing a magnet arrangement similar to that in the permanent magnets.

When each of the upper, lower, left and right cusp magnetic field magnets is partially or entirely disposed inside the vacuum chamber, the permanent magnets are employed as the cusp magnetic field magnets. Each permanent magnet is fixed either directly to the vacuum chamber or thereto via a supporting element as mentioned before. In the case of using such a supporting element, the employment of a secure system for fixing the spaced permanent magnets to the supporting element provides high efficiency in mounting and/or dismounting the permanent magnets to/from the vacuum chamber.

The permanent magnets are fixed either in the direction in which the ion beam does not directly irradiate on the permanent magnets or when a cover made of a non-magnetic material is applied onto/over the permanent magnets. The cover applied onto/over the permanent magnets can be mounted to the supporting element or it can be combined with the supporting element. Graphite, silicon, or the like, prevents metal contamination and has a relatively large thermal conductivity, can be used as for the cover made of non-magnetic material. In case that the cover can not be exposed by the ion beam, aluminum, which can be easily machined and has a higher thermal conductivity, can be employed for the cover. Moreover, a double layer structure can be employed for the cover made of non-magnetic material, in which case, graphite or silicon is used as the material for the first layer, i.e., the surface layer, and aluminum can be used as the material for the second and subsequent layers.

Since there is a risk of the demagnetization on the permanent magnets due to heat, it is preferable that the cusp magnetic field magnets and/or the supporting element including the cover, the above-mentioned elements being disposed in the vacuum chamber, have a structure which can suppress an increase in the temperature of these elements due to the reduced thermal conductivity to the vacuum chamber, either by preserving a good contact with the vacuum chamber or by increasing the area of the surface which is in contact with the vacuum chamber. A material having a thermal conductivity of less than 100 W/mK can be employed for the supporting element, including the cover. Moreover, as mentioned before, it is useful to use cooling water in order to cool the permanent magnets and the parts in the vicinity thereof.

Figure 15:
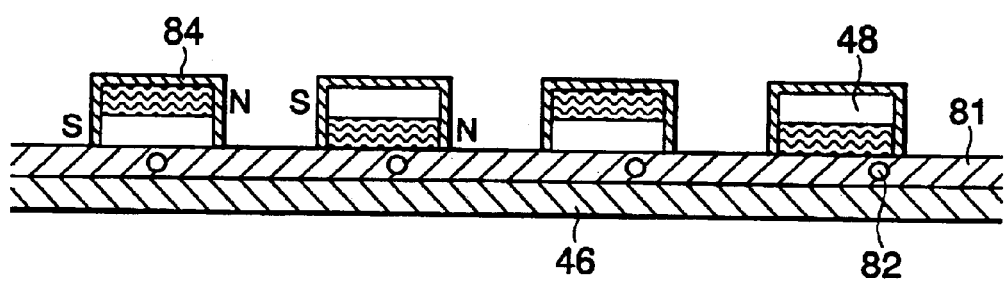
FIG. 15 is a sectional view showing a structure of the cusp magnetic field magnet assembly disposed inside the vacuum chamber.

FIG. 15 shows the structure of the magnet assembly disposed inside the vacuum chamber 46. A plurality of permanent magnets 48 are attached to the supporting member 48 that is attached to the inner wall of the vacuum chamber 46. Each of the permanent magnets 48 is covered by the cover 84.

A samarium-cobalt magnet has a greater residual magnetic flux density and exhibits a relatively small permanent reduction in magnetization due to heat. Such a system can be employed as the material of the permanent magnets. If the permanent magnets can always be maintained at a temperature of less than 60° C., a neodymium-iron-boron magnet can be employed. It is further desirable to use permanent magnets which have a residual magnetic flux density of more than 8 k Gauss and a coercive force of 1.2 times the product of the residual magnetic flux density and the permeability in vacuum at a temperature of 60° C.

Figure 14:
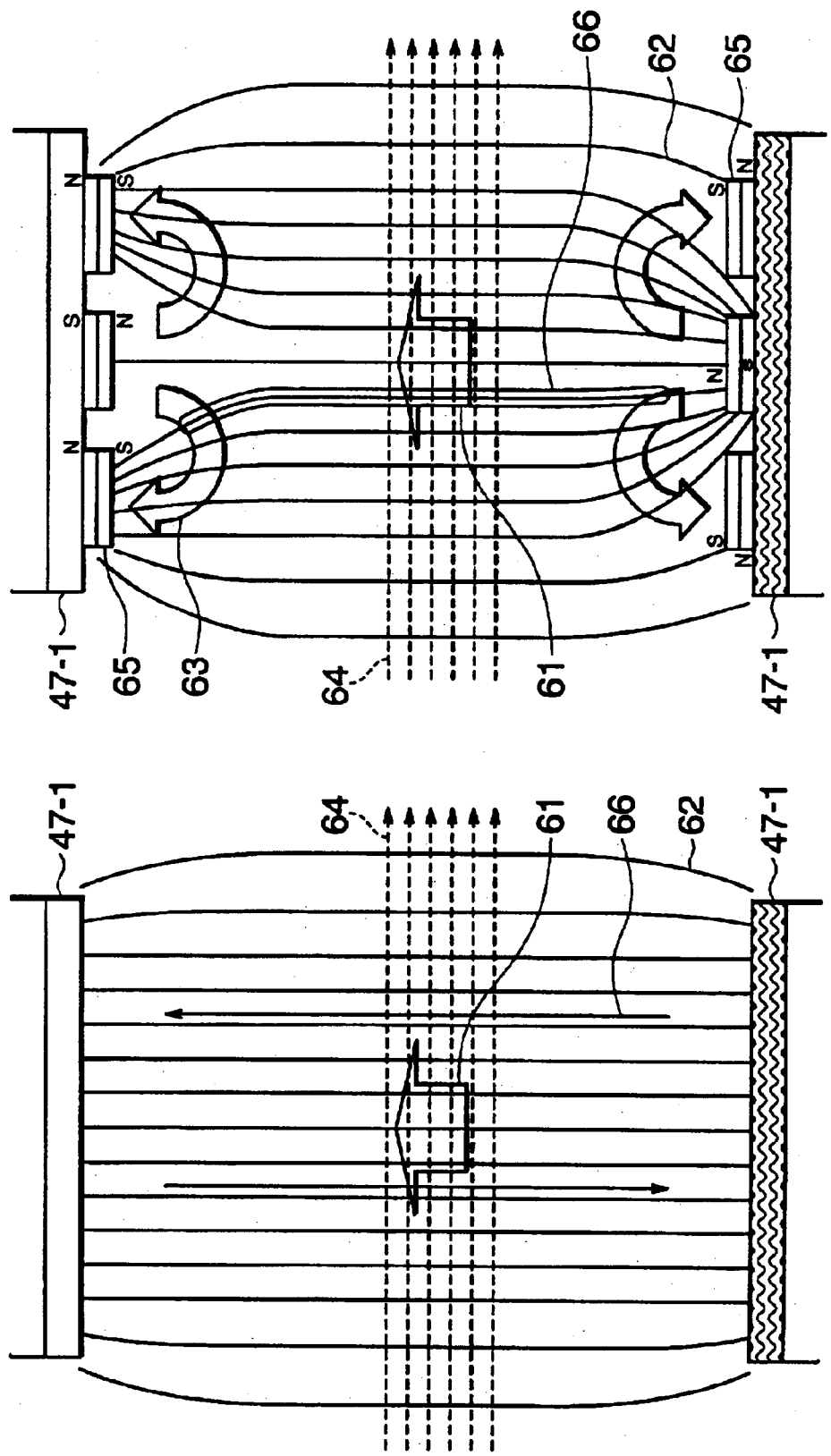
FIGS. 14A and 14B are drawings for respectively showing the relationship between ion beams and the magnetic field in the mass analysis magnet apparatus and the relationship between ion beams and the magnetic field when magnets for generating the cusp magnetic fields are mounted onto magnetic poles of the mass analysis magnet apparatus.

In the area of the magnetic field produced by the mass analysis magnet apparatus 47 for deflecting the ion beam, an approximately parallel analyzing magnetic field 61 for deflecting the ion beam is generated over a wide area between the facing magnetic poles 47-1 in the mass analysis magnet apparatus 47, even when the cusp magnetic field magnets do not exist, as shown in FIG. 14A. Consequently, each electron moves spirally along a magnetic force line 62, and the length of the center trajectory 66 of the motion increases to some extent, thereby increasing the lifetime of the electron. However, the analyzing magnetic field 61 has an approximately homogeneous field strength even in the vicinity of the magnetic poles 47-1, hence having almost no effect on the repulsion of the electrons. Accordingly, the electrons proceed along the analyzing magnetic field 61. Eventually, the electrons collide with the magnetic poles 47-1 of the mass analysis magnet apparatus and then disappear.

When cusp magnetic field magnets 65 are mounted onto the surfaces of the facing magnetic pole 47-1 in the mass analysis magnet apparatus, it can be understood from the magnetic fields at the area between the magnetic poles 47-1 of the mass analysis magnet apparatus, as shown in FIG. 14B, that the above-mentioned disappearance of electrons can be suppressed. In the vicinity of the magnetic poles 47-1 of the mass analysis magnet apparatus, the strength of the analyzing magnetic field decreases with a decrease in the ion beam energy, and therefore the effect of the cusp magnetic field increases, thereby enhancing the efficiency of repelling electrons. In FIG. 14B, 63 and 64 represent the cusp magnetic field and the ion beam trajectory, respectively.

On the other hand, the upper and lower magnetic fields 63 cancel each other in the vicinity of the ion beam trajectory 64, so that the cusp magnetic field can be neglected, compared with the analyzing magnetic field required in the ion implantation apparatus. Hence, the ion beam can be deflected accurately without being affected by the disturbance resulting from the cusp magnetic field. Since a higher ion energy provides a weaker space charge effect and thus no reduction in the transportation efficiency of the ion beam, the reduction in the effect of the cusp magnetic field causes no beam deflection problem.

Incidentally, there is less necessity to mount cusp magnetic field magnets for confining the electrons in the direction perpendicular to the plane of drawing. This is because it is difficult to guide the electrons in the direction other than the up/down direction in the area Z1 (FIG. 7) where there is an analyzing field resulting from the mass analysis magnet apparatus.

Permanent magnets are employed as the cusp magnetic field magnets mounted between the magnetic poles of the mass analysis magnet apparatus. Actually, the vacuum chamber is inserted between the magnetic poles, and therefore the permanent magnets are located in the space between the vacuum chamber and the magnetic poles of the mass analysis magnet apparatus. The permanent magnets are fixed not to the vacuum chamber, but to the magnetic poles of the mass analysis magnet apparatus. This is due to the fact that the fixing position is normally in air, and the maintenance work in the vicinity of the mass analysis magnet apparatus can be carried out without any risk of injury when the permanent magnets are fixed to the iron magnetic poles of the mass analysis magnet apparatus, after energizing of the mass analysis magnet apparatus is stopped. A supporting element composed of a non-magnetic material can be used to fix the permanent magnets.

For the sake of easy maintenance work, the cusp magnetic field magnets are fixed to the magnetic poles of the mass analysis magnet apparatus and the fixing is carried out in air. In other words, there is no essential difference in the magnetic field structure between the two different fixing methods, that is, the one in which the cusp magnetic field magnets are fixed to the outside of the vacuum chamber and the other in which the cusp magnetic field magnets are fixed to the inside of the vacuum chamber.

As for the permanent magnets, it is preferable to use a material providing a very small demagnetization even if the maximum magnetic field generated by the mass analysis magnet apparatus is applied in the direction opposite to the magnetic field of the permanent magnet. This is due to the fact that, as shown in FIG. 14B, half of the permanent magnets are exposed to the magnetic field of the mass analysis magnet apparatus, said magnetic field being in the opposite direction to that of the magnetic fields resulting from half of said permanent magnets. As for the permanent magnets, it is desirable to select a material which has a coercive force on the order of 1.2 times the product of the maximum magnetic field strength of the mass analysis magnet apparatus and the vacuum permeability, and which provides a very small demagnetization even if the inverse magnetic field is applied. As an example, in the case of a mass analysis magnet apparatus for generating a magnetic field of 12 k Gauss, it is desirable to select a material having a coercive force of more than 14 k Oe (1100 k A/m). At the present time, a neodymium-iron—boron magnet provides such a high coercive force.

The cusp magnetic field magnet can be produced in a rod shape magnet, a pillar shape having a substantially elongated ellipsoidal section, or a combination of a pillar shape having a circular cross-section and a pillar shape having a polygonal cross-section.

Moreover, in conjunction with the employment of the cusp magnetic field magnets, a very small amount of conventionally known gas, for instance, inert gas such as argon, nitrogen, xenon, etc, as well as a molecular gas such as water vapor or the like can be introduced into the vacuum chamber. In this case, both an increased production of ions and an increase in the lifetime of generated electrons take place simultaneously, thereby enabling the beam current to be further increased.

The most prominent effect in increasing the beam current can be obtained when the gas used together with the employment of the cusp magnetic field magnets is introduced into an area between the extraction electrodes for the ion source and the mass analysis magnet apparatus. This results from the fact that all ions extracted from the ion source, including the ion species other than the required ions, pass through the area between the extraction electrodes and the mass analysis magnet apparatus, and all of the ions contribute to the space charge effect, thereby strongly affecting the divergence of the ion beam.

In the above description, the terms "upper, lower, left and right" are used for the sake of convenience. These do not imply absolute upper, lower, left and right, but rather indicate the relative spatial positions.

Moreover, in the case of employing the rear-stage electrodes 32 for accelerating/decelerating the ions, as shown in FIG. 3, the distance between the rear part of the mass analysis magnet apparatus 47 and the mass analysis slit 43 is designed to be more than two, times greater than the distance between the extraction electrodes 42 and the front part of the mass analysis magnet apparatus 47. In addition, a cusp magnetic field for converging the mass analyzed ion beam is interposed on the beam line between the rear part of the mass analysis magnet apparatus 47 and the mass analysis slit 43. Otherwise, the distance between the rear part of the mass analysis magnet apparatus 47 and the mass analysis slit 43 can be designed to be greater than half of the distance between the extraction slits 42 and the front part of the mass analysis magnet apparatus 47, and, at the same time, the distance from the mass analysis slit 43 to the substrate 44 via the rear stage electrode 32 can be designed to be smaller than half of the distance between the rear part of the mass analysis magnet apparatus 47 and the mass analysis slit 43.

In the embodiment shown in FIGS. 6 and 7, magnets 48 forming the magnet assembly are disposed over the entire area of the ion beam line extending from the ion source 42 to the process chamber 45. As another embodiment, the magnet assembly can be disposed in the following manners.

For instance, the magnet assembly can be disposed in the mass analysis magnet apparatus 47 and sections of the ion beam line that are connected to the front and rear parts thereof.

The magnet assembly can be disposed in a section of the ion beam line that extends from the vicinity of the extraction electrodes 42 to the vicinity of the exit of the mass analysis magnet apparatus 47.

The magnet assembly can be disposed in a section of the ion beam line that extends from the vicinity of the extraction electrodes 42 to the entrance of the mass analysis magnet apparatus 47.

The magnet assembly can be disposed in a section of the ion beam line that extends from the vicinity of the exit of the mass analysis magnet apparatus 47 to the vicinity of the mass analysis slit 43.

The magnet assembly can be disposed in a section of the ion beam line that extends from the vicinity of the mass analysis slit 43 to the substrate 44.

The magnet assembly can be disposed in a section of the ion beam line that extends from the vicinity of the entrance of the mass analysis magnet apparatus 47 to the vicinity of the mass analysis slit 43.

The magnet assembly can be disposed in a section of the ion beam line that extends from the vicinity of the extraction electrodes 42 to the vicinity of the mass analysis slit 43 via the mass analysis magnet apparatus 47.

The magnet assembly can be disposed in a section of the ion beam line that extends from the vicinity of the extraction electrodes 42 to the vicinity of the substrate 44 via the mass analysis magnet apparatus 47 and the mass analysis slit 43.

In the ion implantation apparatus according to the present invention, cusp magnetic fields are produced at appropriate positions over the ion beam line extending from the ion source to the substrate, thereby enabling the density of both electrons and negative ions to be increased in the vicinity of the ion beam. The formation of the cusp magnetic fields provides mutual repulsion between positive charged particles in the ion beam, and therefore efficiently reduces the space charge effect.

As a result, the ion implantation apparatus according to the present invention causes neither an increase in the size nor loss of the ions, thereby enabling the current of the ion beam to be greatly increased. This remarkable effect can be recognized particularly for low energy ion beams, which strongly suffer the space charge effect. Accordingly, an excellent low-energy ion implantation apparatus can be obtained by the present invention.

What is claimed is:

1. An ion implantation apparatus comprising:
    an ion beam line extending from an ion source which generates ions to a substrate to be implanted by the ions, said ion beam line including:
        extraction electrodes for extracting the ions from said ion source as an ion beam,
        a mass analysis magnet apparatus for carrying out mass analyzing of the ions thus extracted, and
        a mass analysis slit for the ions that are mass analyzed by said mass analysis magnet apparatus to pass through, said mass analysis slit being placed on said ion beam line between a rear face of said mass analysis magnet apparatus and said substrate, the analyzed ions passed through said mass analysis slit being directly implanted into said substrate by drifting transportation or being implanted into said substrate after acceleration or deceleration,
    an acceleration electrode or a deceleration electrode being placed on said ion beam line between a rear face of said mass analysis slit and said substrate, said ion beam being carried from said ion source to said substrate through said ion beam line, wherein:
    said ion beam line is continuously surrounded with multiple magnet assemblies which generate cusp magnetic fields, said cusp magnetic fields being jointed continuously to each other, wherein said continuously jointed cusp magnetic fields confine said ion beam.

2. An ion implantation apparatus according to claim 1, wherein said multiple magnet assemblies are disposed in part of the ion beam line that extends from a front face of said mass analysis magnet apparatus to the rear face of said mass analysis magnet apparatus, said cusp magnetic fields generated by said multiple magnet assemblies being jointed continuously from the front face of said mass analysis magnet apparatus to the rear face of said mass analysis magnet apparatus.

3. An ion implantation apparatus according to claim 1, wherein said multiple magnet assemblies are disposed in a section of the ion beam line that extends from a vicinity of said extraction electrodes to a vicinity of an exit of said mass analysis magnet apparatus.

4. An ion implantation apparatus according to claim 1, wherein said multiple magnet assemblies are disposed in a section of the ion beam line that extends from a vicinity of said extraction electrodes to an entrance of said mass analysis magnet apparatus.

5. An ion implantation apparatus according to claim 1, wherein said multiple magnet assemblies are disposed in a section of the ion beam line that extends from an exit of said mass analysis magnet apparatus to a vicinity of said mass analysis slit.

6. An ion implantation apparatus according to claim 1, wherein said multiple magnet is assemblies are disposed in a section of the ion beam line that extends from a vicinity of said mass analysis slit to said substrate.

7. An ion implantation apparatus according to claim 1, wherein said multiple magnet is assemblies are disposed in a section of the ion beam line that extends from a vicinity of an entrance of said mass analysis magnet apparatus to a vicinity of said mass analysis slit.

8. An ion implantation apparatus according to claim 1, wherein said multiple magnet assemblies are disposed in a section of the ion beam line that extends from a vicinity of said extraction electrodes to said mass analysis slit via said mass analysis magnet apparatus.

9. An ion implantation apparatus according to claim 1, wherein said multiple magnet assemblies are disposed in a section of the ion beam line that extends from a vicinity of said extraction electrodes to a vicinity of said substrate via said mass analysis magnet apparatus and said mass analysis slit.

10. An ion implantation apparatus according to claim 1, wherein said ion beam line includes several sections, and wherein conditions for the magnetic fields of said multiple magnet assemblies can be varied in accordance with the conditions for respective sections of the ion beam line.

11. An ion implantation apparatus according to claim 1, wherein said multiple magnet assemblies comprise a plurality of assembly magnets spaced along the ion beam line, and pole surfaces of said assembly magnets are arranged to provide an alternating arrangement of N and S poles, said pole surfaces facing the ion beam line.

12. An ion implantation apparatus according to claim 1, wherein said multiple magnet assemblies comprise a plurality of approximately rectangular or rod-shaped assembly magnets, wherein pole surfaces of said assembly magnets are arranged to face the ion beam line.

13. An ion implantation apparatus according to claim 1, wherein said multiple magnet assemblies comprise a plurality of assembly magnets, and magnetic poles of said assembly magnets are serially disposed in a direction of the ion beam line, the magnetic poles of said assembly magnets facing a direction perpendicular to the ion beam line.

14. An ion implantation apparatus according to claim 1, wherein said multiple magnet assemblies include assembly magnets are arranged wherein magnetic poles of said assembly magnets respectively face two planes, a deflection surface of the ion beam being interposed between said two planes.

15. An ion implantation apparatus according to claim 1, wherein said multiple magnet assemblies include assembly magnets are arranged wherein magnetic poles of a first set of said assembly magnets respectively face two first planes, a deflection surface of the ion beam being interposed between said two first planes, and magnetic poles of a second set of said assembly magnets respectively face two second planes perpendicular to said first planes, said ion beam being interposed between said two second planes.

16. An ion implantation apparatus according to claim 1, wherein said mass analysis magnet apparatus includes mass analysis magnets, the ion beam being interposed between facing magnetic pole surfaces of said mass analysis magnets, and wherein said multiple magnet assemblies include assembly magnets disposed inside said mass analysis magnet apparatus, said assembly magnets being arranged wherein respective magnetic pole surfaces of said assembly magnets face corresponding pole surfaces of said mass analysis magnets.

17. An ion implantation apparatus according to claim 16, wherein said mass analysis magnet apparatus is approximately fan-shaped in plan view, and said assembly magnets in said multiple magnet assemblies are arranged wherein a strength of a magnetic field generated by pole surfaces of said assembly magnets increases when positions of the assembly magnets vary from an inside radius to an outside radius of said mass analysis magnet apparatus.

18. An ion implantation apparatus according to claim 16, wherein said assembly magnets disposed inside said mass analysis magnet apparatus are fixed either directly or via a supporting element to the magnetic poles surfaces of said mass analysis magnet apparatus and are disposed in air.

19. An ion implantation apparatus according to claim 16, wherein said assembly magnets disposed inside said mass analysis magnet apparatus are permanent assembly magnets having a coercive force of more than 1.2 times a product of a maximum strength of an analyzing magnetic field and the vacuum permeability are employed.

20. An ion implantation apparatus according to claim 1, wherein said multiple magnet assemblies include assembly magnets disposed on the ion beam line outside said mass analysis magnet apparatus wherein magnetic poles of a first set of said assembly magnets respectively face two first planes, a deflection surface of the ion beam being interposed between said two first planes, and magnetic poles of a second set of said assembly magnets respectively face two second planes perpendicular to said first planes, said ion beam being interposed between said two second planes.

21. An ion implantation apparatus according to claim 1, wherein said multiple magnet assemblies comprise a plurality of assembly magnets disposed to be spaced along the ion beam line wherein pole surfaces of said assembly magnets facing the ion beam have the same polarity and exhibit an alternating arrangement of S and N poles in a direction of the ion beam, wherein a strength of a magnetic field is substantially the same for said assembly magnets whose pole surfaces face each other wherein the cusp magnetic fields are cancelled at the ion beam.

22. An ion implantation apparatus according to claim 20, wherein either the first set of assembly magnets disposed to face said first planes or second set of assembly magnets disposed to face said second plane have a same polarity for pole surfaces, and wherein a polarity of a pole for each set of assembly magnets alternately changes in a direction of the ion beam.

23. An ion implantation apparatus according to claim 20, wherein said first planes are upper and lower planes and said second planes are left and right planes, and wherein the magnetic poles facing the ion beam are N poles for the upper and lower planes and the magnetic poles facing the ion beam are S poles for the left and right planes, or the magnetic poles facing the ion beam are S poles for the upper and lower planes and the magnetic poles facing the ion beam are N poles for the left and right planes, and wherein said first and second sets of assembly magnets are arranged wherein a polarity of the pole alternately reverses in the direction in which the ion beam travels.

24. An ion implantation apparatus according to claim 1, wherein said multiple magnet assemblies comprise a plurality of assembly magnets arranged to be spaced along the ion beam line, and said assembly magnets are disposed wherein a distance between each assembly magnet and the ion beam is the same.

25. An ion implantation apparatus according to claim 1, wherein a relatively small amount of an inert gas and/or a molecular gas is introduced into a space in the ion beam line, where the cusp magnetic fields are dominant.

26. An ion implantation apparatus according to claim 25, wherein the introduction of said molecular gas is carried out in a space located in a vicinity of said extraction electrodes or inside said mass analysis magnet apparatus.

27. An ion implantation apparatus according to claim 1, wherein said multiple magnet assemblies are disposed in a vacuum chamber forming the ion beam line, a removable supporting element is disposed at a location of said multiple magnet assemblies in said vacuum chamber, and said multiple magnet assemblies are connected to said supporting element.

28. An ion implantation apparatus according to claim 27, wherein said supporting element is disposed inside said vacuum chamber.

29. An ion implantation apparatus according to claim 28, wherein said multiple magnet assemblies are disposed inside the vacuum chamber and located at an area where a temperature rise occurs due to a thermal load resulting from the ion beam, permanent assembly magnets having a coercive force of more than 1.2 times a product of residual magnetic flux density at a temperature of 60° C. and the vacuum permeability are employed.

30. An ion implantation apparatus according to claim 27, wherein said supporting element is disposed outside said vacuum chamber.

31. An ion implantation apparatus according to claim 27, wherein to prevent said multiple magnet assemblies from being directly exposed to the ion beam, either said multiple magnet assemblies are supported at an area outside the ion beam by said supporting element or a cover is connected to said supporting element.

32. An ion implantation apparatus according to claim 31, wherein said cover is formed from a material including any one of an aluminum alloy, graphite, or silicon.

33. An ion implantation apparatus according to claim 27, wherein said supporting element is produced by a material having a thermal conductivity greater than 100 W/mK in order to avoid a temperature rise of said multiple magnet assemblies and to effectively perform heat conduction from said multiple magnet assemblies to said vacuum chamber.

34. An ion implantation apparatus according to claim 27, wherein said supporting element has a structure in which a cooling medium is circulated to avoid a rise in temperature of said multiple magnet assemblies.

35. An ion implantation apparatus according to claim 27, wherein said supporting element is formed from a material including any one of an aluminum alloy, graphite, or silicon.

36. An ion implantation apparatus according to claim 1, wherein samarium-cobalt based permanent assembly magnets are employed for said multiple magnet assemblies.

37. An ion implantation apparatus according to claim 1, wherein neodymium-iron-boron based permanent assembly magnets are employed for said multiple magnet assemblies.

38. An ion implantation apparatus according to claim 1, wherein said multiple magnet assemblies comprise a plurality of assembly magnets and a magnetic pole width of each assembly magnet is greater than a cross section of the ion beam.

39. An ion implantation apparatus comprising an ion beam line extending from an ion source for generating ions to a substrate to be implanted by the ions, said ion beam line including extraction electrodes for extracting the ions from said ion source as an ion beam, a mass analysis magnet apparatus for carrying out mass analyzing of the ions thus extracted, and a mass analysis slit for the mass analyzed ions, the ions passed through said mass analysis slit being directly incident on the substrate or being incident on the substrate after being accelerated or decelerated, wherein a distance between a rear part of said mass analysis magnet apparatus and said mass analysis slit is more than two times greater than a distance between said extraction electrodes and a front part of said mass analysis magnet apparatus, and a cusp magnetic field for converging the mass analyzed ion beam is interposed on beam line between the rear part of said mass analysis magnet apparatus and said mass analysis slit.

40. An ion implantation apparatus comprising an ion beam line extending from an ion source for generating ions to a substrate to be implanted by the ions, said ion beam line including extraction electrodes for extracting the ions from said ion source as an ion beam, a mass analysis magnet apparatus for carrying out mass analyzing of the ions thus extracted, a mass analysis slit for the mass analyzed ions, and accelerating or decelerating means for accelerating or decelerating the ions passed through said mass analysis slit, the ions passed through the mass analysis slit being either directly incident on the substrate or being incident on the substrate after being accelerated or decelerated, wherein a distance between a rear part of said mass analysis magnet apparatus and said mass analysis slit is more than two times greater than a distance between said extraction electrodes and a front part of said mass analysis magnet apparatus, and the distance from said mass analysis slit to said substrate via said accelerating or decelerating means is smaller than half of the distance between the rear part of said mass analysis magnet apparatus and said mass analysis slit.

\* \* \* \* \*